(12) United States Patent
Röhrer

(10) Patent No.: US 8,273,621 B2
(45) Date of Patent: Sep. 25, 2012

(54) MOS-FET HAVING A CHANNEL CONNECTION, AND METHOD FOR THE PRODUCTION OF A MOS-FET HAVING A CHANNEL CONNECTION

(75) Inventor: Georg Röhrer, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 323 days.

(21) Appl. No.: 12/531,304

(22) PCT Filed: Feb. 8, 2008

(86) PCT No.: PCT/EP2008/051575
§ 371 (c)(1),
(2), (4) Date: Feb. 16, 2010

(87) PCT Pub. No.: WO2008/110419
PCT Pub. Date: Sep. 18, 2008

(65) Prior Publication Data
US 2010/0148257 A1 Jun. 17, 2010

(30) Foreign Application Priority Data

Mar. 14, 2007 (DE) .......................... 10 2007 012 380

(51) Int. Cl.
*H01L 21/8249* (2006.01)
(52) U.S. Cl. ........ 438/234; 438/199; 438/238; 438/244; 438/256; 438/278; 257/300; 257/315; 257/326; 257/347; 257/E21.507
(58) Field of Classification Search .................. None
See application file for complete search history.

(56) References Cited

U.S. PATENT DOCUMENTS

| 4,656,493 A | 4/1987 | Adler et al. |
| 4,879,254 A | 11/1989 | Tsuzuki et al. |
| 5,185,275 A | 2/1993 | Prall |
| 5,355,008 A | 10/1994 | Moyer et al. |
| 5,430,316 A | 7/1995 | Contiero et al. |

(Continued)

FOREIGN PATENT DOCUMENTS

EP 0 022 388 1/1981

(Continued)

OTHER PUBLICATIONS

Min-Cheol Lee et al, "Characteristics of Asymmetric Dual-gate poly-Sl TFTs for Kink Current Reduction", 2003 SID International Symposium, Bd. XXXIV, May 22, 2003, pp. 252-255.

*Primary Examiner* — Kyoung Lee
(74) *Attorney, Agent, or Firm* — Cozen O'Connor

(57) ABSTRACT

A MOSFET comprising a substrate of a semiconductor material; source/drain regions, which are arranged at a distance from each other at a surface of the substrate; a gate electrode arranged above an area of the surface of the substrate between the source/drain regions, the gate electrode being electrically insulated from the semiconductor material; at least one recess in the gate electrode, a through-contact arranged in the recess of the gate electrode, the through-contact being electrically insulated from the gate electrode; a terminal contact on the semiconductor material; and a terminal conductor arranged on the side of the gate electrode that faces away from the substrate, wherein the through-contact electrically connects the terminal contact to the terminal conductor.

14 Claims, 5 Drawing Sheets

U.S. PATENT DOCUMENTS

| | | |
|---|---|---|
| 6,489,653 B2 | 12/2002 | Watanabe et al. |
| 6,677,190 B1 | 1/2004 | Houston |
| 6,855,978 B2 * | 2/2005 | Kim et al. .................. 257/316 |
| 2003/0052373 A1 | 3/2003 | Hayashi et al. |
| 2004/0201061 A1 | 10/2004 | Jeon et al. |

FOREIGN PATENT DOCUMENTS

| | | |
|---|---|---|
| EP | 0 690 514 | 1/1996 |
| JP | 62217664 | 9/1987 |
| JP | 06 120493 | 4/1994 |
| JP | 10214971 | 8/1998 |

* cited by examiner

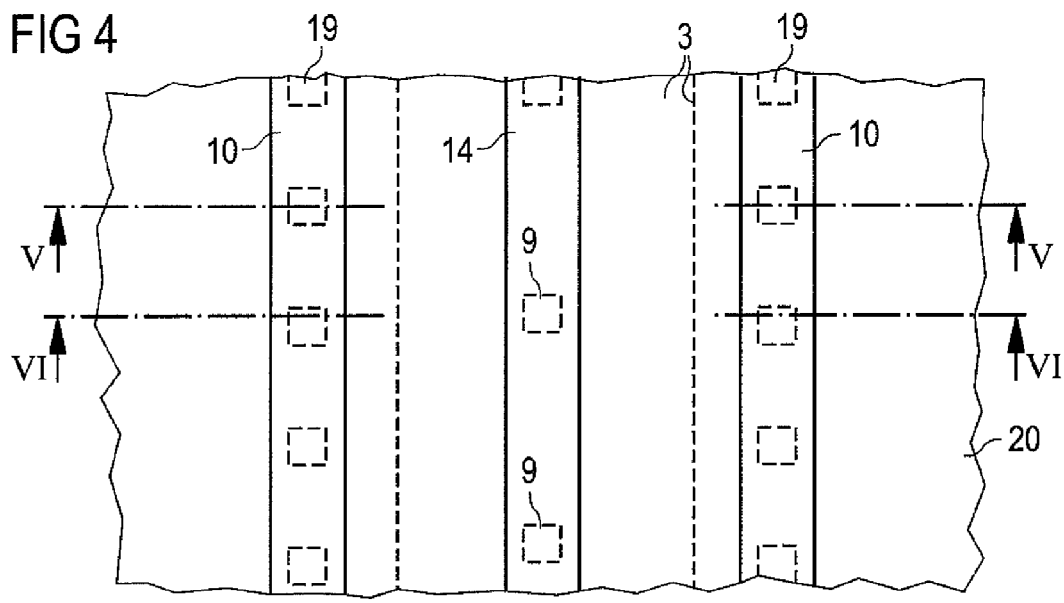
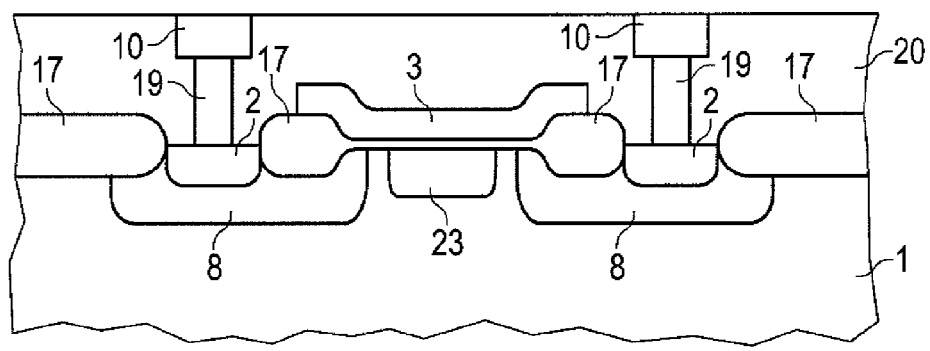
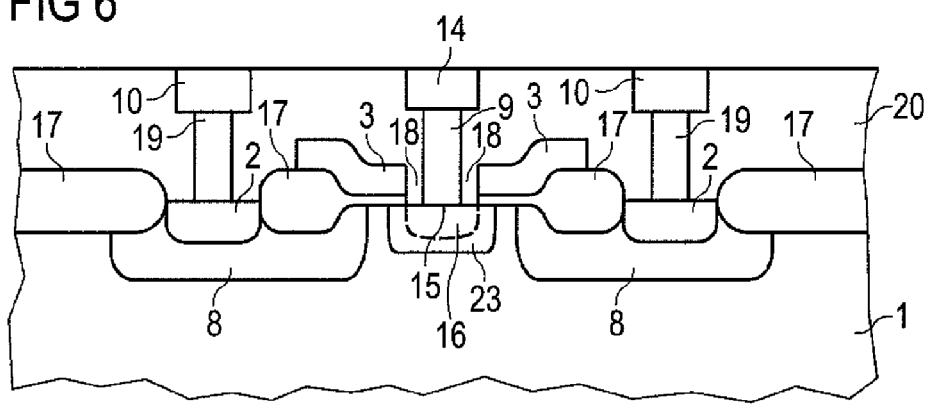

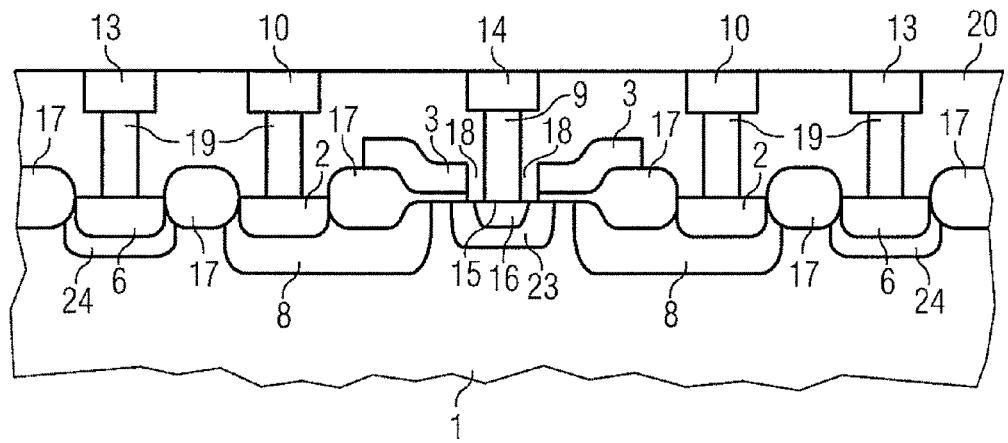
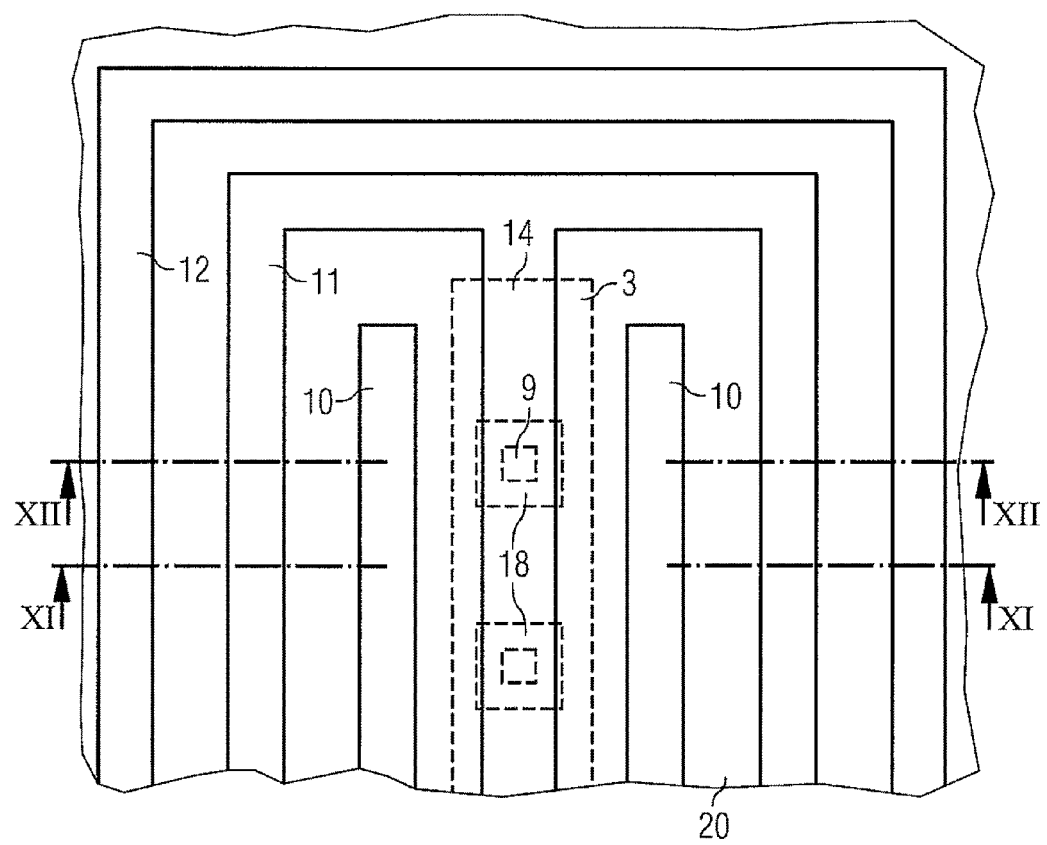

MOS-FET HAVING A CHANNEL CONNECTION, AND METHOD FOR THE PRODUCTION OF A MOS-FET HAVING A CHANNEL CONNECTION

RELATED APPLICATIONS

This is a U.S. national stage of International Application No. PCT/EP2008/051575, filed on Feb. 8, 2008.

This patent application claims the priority of German patent application no. 10 2007 012 380.0 filed Mar. 14, 2007, the disclosure content of which is hereby incorporated by reference.

FIELD OF THE INVENTION

The present invention concerns MOSFETs with improved snapback characteristics, especially symmetric MOSFETs with large channel width.

BACKGROUND OF THE INVENTION

In a MOSFET, doped regions for source and drain are doped oppositely to the surrounding semiconductor material, in which the source/drain regions are embedded and which forms the channel region between the source/drain regions. This can be the semiconductor material with the basic doping of the substrate or a doped well formed in the substrate. The substrate or the well is called the body. The source, channel and drain correspond to the emitter, base and collector of a parasitic bipolar transistor. When this parasitic bipolar transistor becomes conducting, which is called the snapback effect, the blocking voltage and the switching rate of the MOSFET, especially a power MOSFET, are considerably degraded. The parasitic bipolar transistor is switched on by body currents, which cause a voltage drop in the substrate, which leads to a forward voltage of the pn junction between source and body. To eliminate this undesired effect, the source and body are short circuited via an ohmic resistance, for which a body terminal is provided.

This problem is especially serious in the case of symmetric MOSFETs, since their body terminal contacts are located far from the regions in which the body current is produced. Since the gain or amplification factor in the case of a parasitic npn transistor is much greater than in the case of a pnp transistor, mainly N channel MOSFETs are affected by the snapback effect.

Methods for avoiding snapback in the case of high voltage MOSFETs are described in U.S. Pat. No. 5,185,275. A buried $p^+$ layer under the channel is proposed.

U.S. Pat. No. 4,656,493 describes a power MOSFET in which the current amplification of the npn transistor is reduced by providing in its structure a region in which recombination of charge carriers with a relatively low lifetime is provided for the excess majority charge carriers.

SUMMARY OF THE INVENTION

It is an object of the invention to provide a MOSFET with improved snapback characteristics.

This and other objects are attained in accordance with one aspect of the present invention directed to a MOSFET comprising a substrate of a semiconductor material; source/drain regions, which are arranged at a distance from each other at a surface of the substrate; a gate electrode arranged above an area of the surface of the substrate between the source/drain regions, the gate electrode being electrically insulated from the semiconductor material; at least one recess in the gate electrode, a through-contact arranged in the recess of the gate electrode, the through-contact being electrically insulated from the gate electrode; a terminal contact on the semiconductor material; and a terminal conductor arranged on the side of the gate electrode that faces away from the substrate, wherein the through-contact electrically connects the terminal contact to the terminal conductor.

Another aspect of the present invention is directed to a method for producing a MOSFET, comprising the steps of forming source/drain regions at a distance from each other at a surface of a substrate of semiconductor material; arranging a gate electrode above an area of the surface of the substrate present between the source/drain regions and being electrically insulated from the semiconductor material; providing the gate electrode with at least one recess; arranging a through-contact, that is electrically isolated from the gate electrode, in at least one recess of the gate electrode, so that the through-contact forms a terminal contact on the semiconductor material; and forming a terminal conductor at the through-contact.

In a MOSFET according to an embodiment of the invention, the channel region is provided on the upper side with terminal contacts that are connected to an associated terminal wire. For this the gate electrode is provided with recesses through which the through-contacts are brought, which are electrically isolated from the gate electrode. In this way a plurality of body terminal contacts is provided in the region of the channel.

BRIEF DESCRIPTION OF THE DRAWINGS

FIG. 4 shows a top view of another embodiment of the MOSFET.

FIG. 5 shows a cross section through the embodiment of FIG. 4 taken at line V-V.

FIG. 6 shows a cross section through the embodiment of FIG. 4 taken at line VI-VI.

FIG. 9 shows a cross section through the embodiment of FIG. 7 taken at line IX-IX.

FIG. 10 shows a top view of another embodiment of the MOSFET.

DETAILED DESCRIPTION OF THE DRAWINGS

Figure 1:
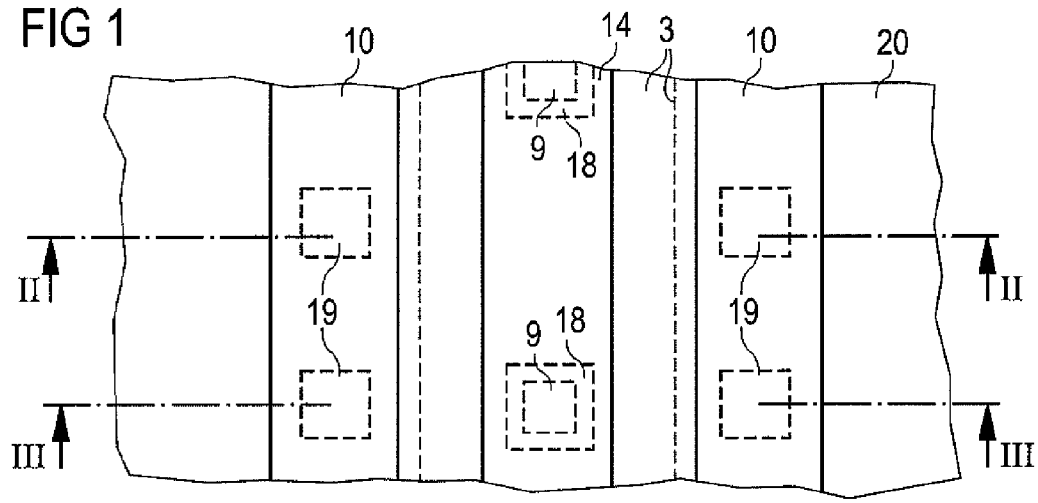
FIG. 1 shows a top view of an embodiment of the MOSFET.

FIG. 1 shows an embodiment of the MOSFET in a top view. In this symmetric MOSFET the terminal conductors 10 for the source/drain regions are arranged in mirror image to the gate electrode 3, the hidden contours of which are indicated here with a dashed line. The terminal connectors 10 are connected via through-contacts 19 to the underlying doped source/drain regions. Recesses 18, which are square in a plan view in this embodiment but could have any shape, are situated spaced apart in gate electrode 3. Three contacts 9, which are electrically isolated from gate electrode 3 are situated in each of recesses 18. The three contacts 9 are in contact on the upper side with a terminal connection 14 and in this way are electrically connected to each other. Since the through-contacts 9 form a contact with the semiconductor material of the channel region, a plurality of connections to the channel region through the gate electrode is realized with the through-contacts 9. These connections to the channel region function as a body terminal of the MOSFET. The spaces between the electrical conductors are filled, for example, with a dielectric material 20, with which the upper side of the element can also be planarized.

Figure 2:
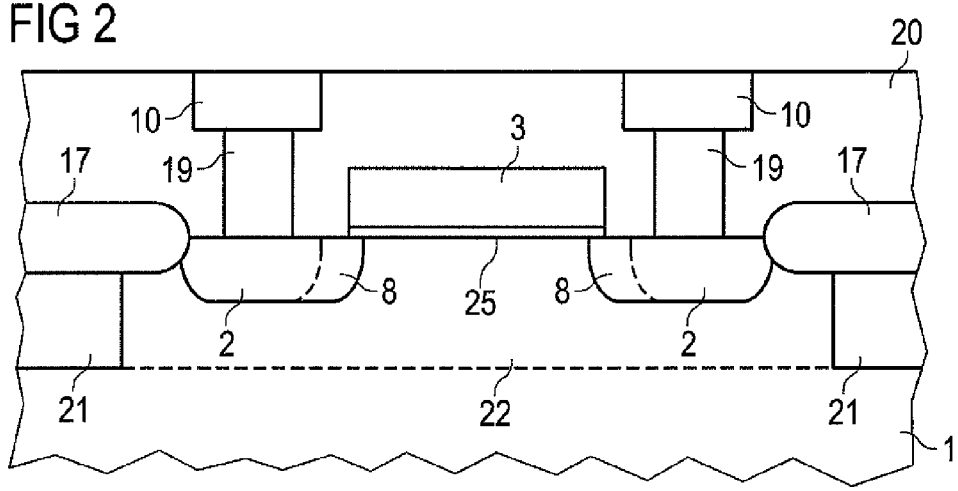
FIG. 2 shows a cross section through the embodiment of FIG. 1 taken at line II-II.

FIG. 2 shows the cross section taken at line II-II of FIG. 1, which is between two through-contacts 9 of gate electrode 3. The transistor structure is described for the example of a N-channel MOSFET. However, the types of conduction could also have opposite sign. In the cross section in FIG. 2 there is a substrate 1 with weak basic doping, in this example for p conduction. A well 22, which is doped more highly for the same conduction type, is formed on an upper side of the substrate and indicated in FIG. 2 by the horizontal broken line. Well 22 is bounded on the side by boundary regions 21 that are oppositely doped, thus in this example they are p conducting. In well 22 on the upper side of substrate 1, source/drain regions 2 are arranged at intervals, and between them the semiconductor material of the well 22 is situated, which is provided to form the channel of the transistor. Up to the channel there are more weakly doped LDD (lightly doped drain) regions 8 at the source/drain regions 2. These LDD regions 8 are usually present in MOSFETs but they can also be omitted. The transistor structure is supplemented by the gate electrode 3, which is arranged, electrically insulated from the semiconductor material, above the area 25 of the upper side of the substrate 1 that is present between the source/drain regions 2, and which gate electrode is provided to control the channel. The transistor structure in this example is bounded on the side by field oxide 17. The source/drain regions are in contact with the vertical through-contacts 19, which connect the source/drain regions to the terminal conductors 10.

Figure 3:
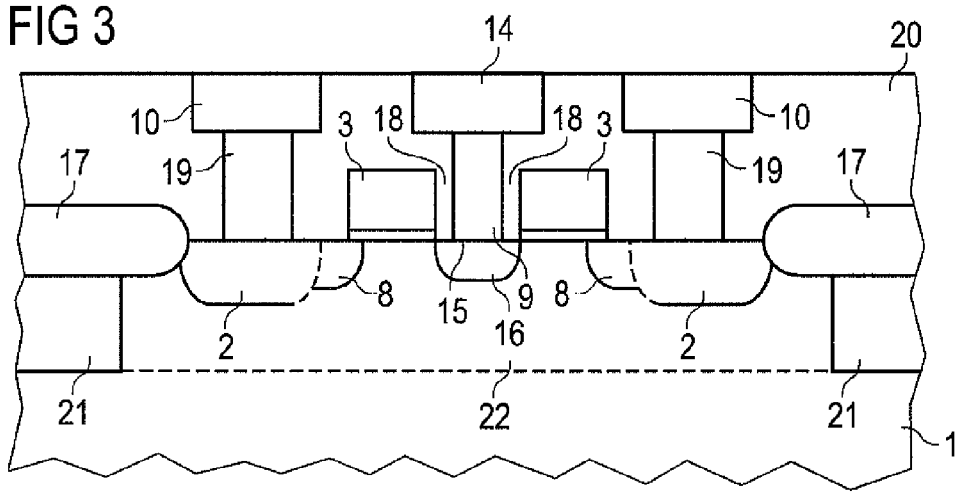
FIG. 3 shows a cross section through the embodiment of FIG. 1 taken at line III-III.

FIG. 3 shows the cross section taken at line III-III through the through-contact 9 in the gate electrode 3 of FIG. 1. In gate electrode 3 one can see the recess 18, within which the through-contact 9 is arranged. In the channel region there is a contact region 16 that is more highly doped than the surrounding semiconductor material of the well 22, but for the same types of conduction, thus in this example for p conduction. The contact region 16 can, for example, be self-aligned to recess 18 by means of implantation through recess 18. Recess 18 can be reduced a little in its lateral dimensions by side wall spacers at the gate electrode 3 before implantation of the contact region 16, so that the contact region 16 is not designed to reach all the way up to the lower gate edge. Instead of this, the contact region 16 can also be implanted, self aligning to the through-contact 9 that is made, only until after the application of the dielectric 20 through a contact hole made in dielectric 20. FIG. 3 shows the result of the first indicated possibility, specifically implantation self aligned to the recess 18. The through-contact 9 can be made so that a contact hole is made in the dielectric 20 in the region of recess 18 in which the semiconductor material of the channel region is exposed and the contact hole is filled with electrically conducting material. The remaining material of dielectric 20 within recess 18 forms an electric isolation around the through-contact 9. Between the through-contact 9 and the contact region 16 there is a terminal contact 15 on the channel region.

The through-contact 9 is electrically connected on the upper side to the terminal conductor 14 for the channel region. The terminal conductor 14 electrically connects the through-contacts 9 to each other so that there is a terminal contact 15 at regular intervals in the channel region. These terminals function as body terminals, to which a separate body terminal to well 22 can be provided in addition to the gate electrode.

FIG. 4 shows a top view of another embodiment of a MOSFET structure for a power transistor. This embodiment differs from that in FIG. 1 essentially only by the somewhat different dimensions of the components and their layout. The differences however become clear from the cross sections marked in FIG. 4 and shown in FIGS. 5 and 6.

The cross section of FIG. 5 corresponds to the cross section of FIG. 2 between the through-contacts 9. The substrate 1 is provided with a basic doping, for example $p^-$ conducting. On the upper side of substrate 1 are the source/drain regions 2, which are designed to be $n^+$ conducting in the case of a p type basic doping. An LDD region 8, which is less doped for the same type of conduction and which here forms the drift path, surrounds each of the source/drain regions 2 at least up to the channel region. The gate electrode 3 is situated on a field oxide 17 on each of the source- and drain-side edges. The source/drain regions 2 here, too, are also provided with through-contacts 19, which electrically connect the source/drain regions 2 to the terminal conductors 10. Another doped region 23 that is shown in this embodiment can be provided in the channel region to adjust the threshold voltage of the transistor as specified. The additional doped region 23 is designed for the same sign of conduction as the basic doping, thus for a conduction type opposite to the source/drain regions 2.

FIG. 6 shows a cross section through the through-contact 9 in gate electrode 3. The through-contact 9 is arranged in a recess 18 of gate electrode 3 and contacts the additional doped region 23, which for this purpose is provided with a sufficiently high dopant concentration, in a terminal contact 15, and is electrically connected to the upper side terminal conductor 14 for the channel region. In addition to the additional doped region 23 there can be a contact region 16 that is self-aligned to recess 18 as in the embodiment in FIG. 3, and in this case can be embedded in the additional doped region 23.

Figure 7:
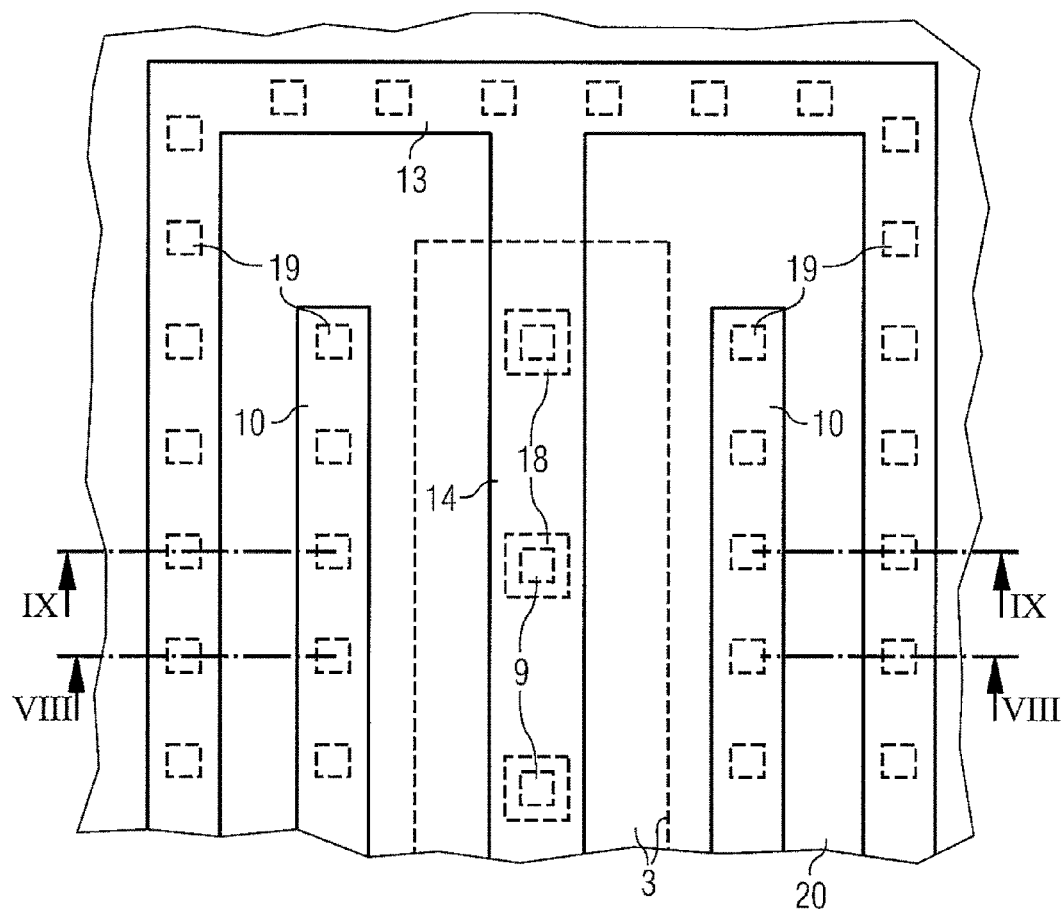
FIG. 7 shows a top view of another embodiment of the MOSFET.

FIG. 7 shows a view of an embodiment in which a terminal conductor 13 for the substrate is arranged in a frame-like shape and is connected to the terminal conductor 14 for the channel region. The marked cross sections are shown in FIGS. 8 and 9.

Figure 8:
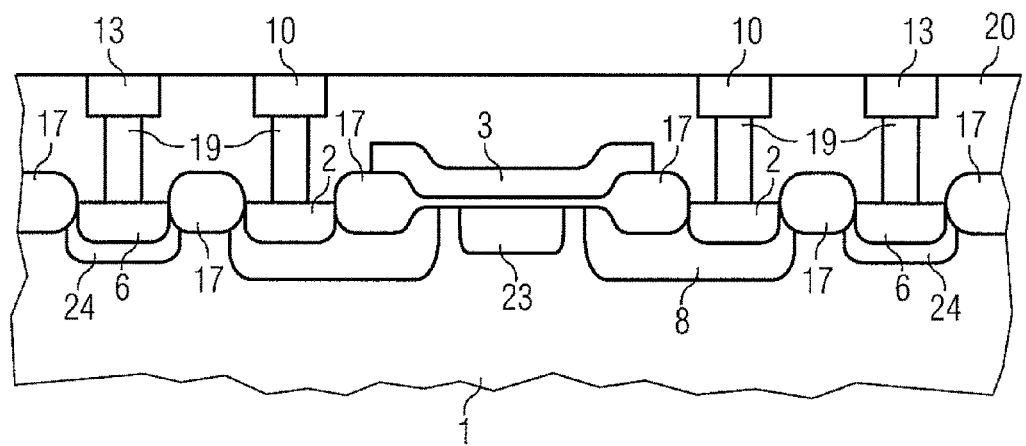
FIG. 8 shows a cross section through the embodiment of FIG. 7 taken at line VIII-VIII.

The cross section in FIG. 8 corresponds in its inner region to the cross section of FIG. 5. With the embodiment according to FIG. 8 there is additionally a contact region 6 for the body terminal. This contact region 6 is highly doped for the conduction type of substrate 1 and is provided with a plurality of through-contacts 19, which connect the contact region 6 with the terminal conductor 13 for the substrate. The contact regions 6 can, as indicated in FIG. 8, also be formed by multiple implantations, so that a highly doped contact region 6 is embedded in a somewhat deeper but not so highly doped terminal region 24. The terminal regions 24 in this embodiment are formed by doped regions that, for example, can be implanted together with the additional doped region 23 provided in the channel region.

In FIG. 9 the cross section is shown parallel to the cross section of FIG. 8 through the through-contact 9 in recess 18 of gate electrode 3. In this embodiment, in addition to the additional doped region 23, there is a contact region 16 in the channel that is made self-aligned to the recess 18. The position of the side boundaries of contact region 16 indicates that, in this example, the inner side walls of recess 18 were provided with side wall spacers before the implantation of contact region 16, so that the contact region 16 has an appropriate distance from gate electrode 3. The side wall spacers are not drawn, since they can be made of the same material as dielectric 20, for example the oxide of the semiconductor material. The contact region 16 can, for example, be implanted together with the contact regions 6 for the body terminal. Contact region 16 is connected to through-contact 9 via a terminal contact 15. The contact region 16 can, however, also be omitted; the terminal contact 15 is then situated directly on the additional doped region 23. Instead, corresponding to FIG. 3, the additional doped region 23 can be omitted and only the contact region 16 provided therefor.

The MOSFET can in particular be made as a completely isolated power MOSFET. A corresponding embodiment is shown in FIGS. 10, 11 and 12.

FIG. 10 shows a plan view, in which, instead of the terminal conductor for the substrate, a terminal conductor 11 for a first deep well and a terminal conductor 12 for a second deep well are arranged in a frame shape. The terminal conductor 11 for the first deep well is connected to the terminal conductor 14 for the channel region. The gate electrode 3, the recesses 18 formed therein and the through-contacts 9 arranged in the recesses are drawn with broken lines, as hidden contours.

Figure 11:
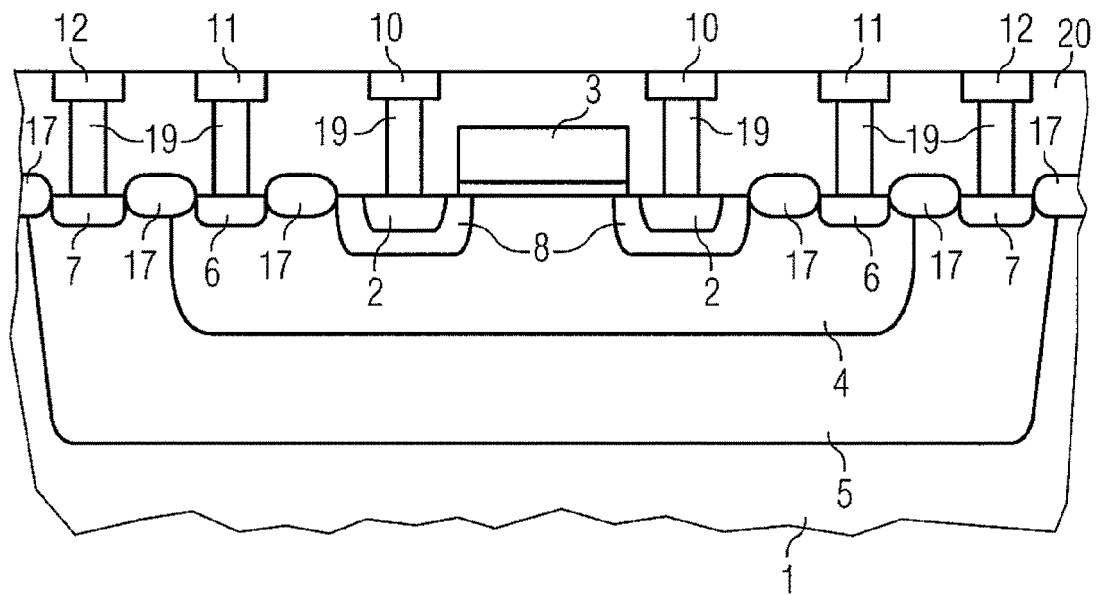
FIG. 11 shows a cross section through the embodiment of FIG. 10 taken at line XI-XI.

FIG. 11 shows the cross section taken at line XI-XI marked in FIG. 10. In the case of an N-channel MOSFET the first deep well 4 is doped to be p-conducting. The second deep well 5, in which the first deep well 4 is arranged, is in this example doped to be n-conducting. The second deep well 5 is situated in the semiconductor material with the basic doping of substrate 1. The contact region 6 for the body terminal in this embodiment is present in the first deep well 4. It is connected via the corresponding through-contacts 19 to the terminal conductor 11 for the first deep well 4. Now, in addition, there is a contact region 7 for the terminal to the second deep well 5. The contact region 7 for the second deep well is connected via the corresponding through-contacts 19 to the pertinent terminal conductor 12 for the second deep well 5. The gate electrode 3 is made flat in this example; the source-side and drain-side edges of the gate electrode can, however, instead also be arranged on field oxide regions.

Figure 12:
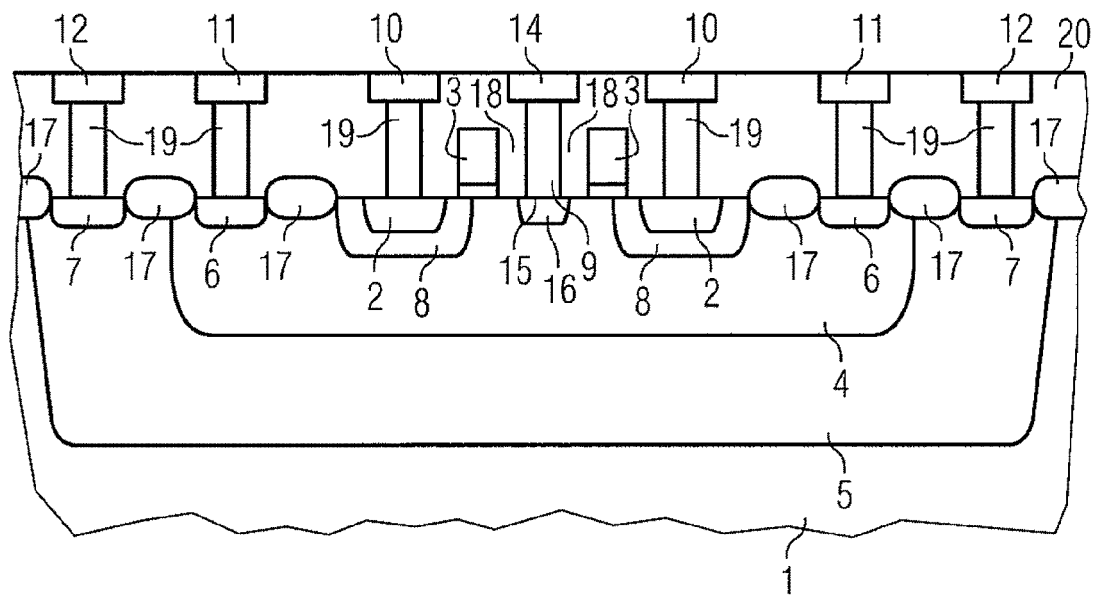
FIG. 12 shows a cross section through the embodiment of FIG. 10 taken at line XII-XII.

FIG. 12 shows the cross section through through-contact 9 in recess 18 of gate electrode 3 as taken at line XII-XII shown in FIG. 10. The through-contacts 9 that are arranged in the recesses 18, as previously described, connect a terminal contact 15 to a contact region 16 in the channel with an upper-side terminal conductor 14. The contact region 16 in this example is made self-aligned to through-contact 9. The relevant implantation takes place in this embodiment through a contact hole in the dielectric 20 before the contact hole is filled with the electrically conducting material of the through-contact 9. The different designs of the contact region 16 and the additional doped region 23 are suitable for all embodiments, even if they were previously described only for one of the given embodiments.

With the MOSFET according to an embodiment of the invention the body terminal is thus provided directly in the channel region of a preferably symmetric transistor. The maximum spacing between the regions in which the body current is produced and the body terminal contacts is thus independent of the overall dimension of the device. The intermediate space between the body terminal contacts can, as a parameter of the device, be optimized without additional measures, namely so that the snapback voltage becomes sufficiently high with as few body contacts as possible. With that, the number of body contacts can be kept sufficiently low to keep the on-resistance of the device sufficiently low.

As the described embodiments show, a frame-shaped or ring-shaped body terminal region can, with the MOSFET in accordance with the invention, basically be present or can be left out. Contact regions 16 provided on the channel region, for realization of a low metal-semiconductor transition, are highly doped and, for example, are made together with implantations for the usually highly doped contact regions. This can take place in a self-aligned manner with respect to the recesses 18 provided in gate electrode 3.

The invention is suitable for symmetric high voltage transistors, especially for power n-MOSFETS, but is basically also applicable in the case of other MOSFETs too. In the case of symmetric MOSFETs, the terminal contacts 15 of the channel region can be arranged along a straight line from which the source/drain regions 2 have the same spacing.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A MOSFET comprising:
a substrate of a semiconductor material;
source/drain regions, which are arranged at a distance from each other at a surface of the substrate;
a gate electrode arranged above an area of the surface of the substrate between the source/drain regions, the gate electrode being electrically insulated from the semiconductor material;
at least one recess in the gate electrode, a through-contact arranged in the recess of the gate electrode, the through-contact being electrically insulated from the gate electrode;
a terminal contact on the semiconductor material; and
a terminal conductor arranged on a side of the gate electrode that faces away from the substrate, wherein the through-contact electrically connects the terminal contact to the terminal conductor.

2. The MOSFET of claim 1, wherein the terminal contact forms a substrate contact or a well contact for a doped well formed in the substrate.

3. The MOSFET of claim 1, further comprising a region that is highly doped by comparison with the adjacent semiconductor material, the terminal contact being situated on the region.

4. The MOSFET of claim 1, further comprising:
a contact region that is highly doped by comparison with the adjacent semiconductor material, the terminal contact being situated on the contact region, and
the contact region being formed self-aligned to the through-contact.

5. The MOSFET of claim 1, further comprising:
a contact region that is highly doped by comparison with the adjacent semiconductor material, the terminal contact being situated on the contact region, and
the contact region being formed self-aligned to the recess or self-aligned to the recess that is reduced in size by side wall spacers.

6. The MOSFET according to claim 1, further comprising:
a plurality of terminal contacts, the terminal contacts each being formed by a through-contact arranged in a recess of the gate electrode on the semiconductor material, and the terminal contacts being arranged along a straight line, from which the source/drain regions have the same distance.

7. The MOSFET according to claim 1, further comprising:
a doped first well, the source/drain regions being arranged in the doped first well, and
a second well that is oppositely doped to the doped first well, the doped first well being arranged in the second well.

8. The MOSFET of claim 7, further comprising:
a contact region, the first well being provided with the contact region;
a terminal conductor; and
a through-contact, which electrically connects the contact region of the first well to the terminal conductor.

9. The MOSFET according to claim 1, wherein the MOSFET is a high voltage transistor.

10. A method for producing a MOSFET, comprising the steps of:
forming source/drain regions at a distance from each other at a surface of a substrate of semiconductor material;
arranging a gate electrode above an area of the surface of the substrate present between the source/drain regions and being electrically insulated from the semiconductor material;
providing the gate electrode with at least one recess;
arranging a through-contact, that is electrically isolated from the gate electrode, in at least one recess of the gate electrode, so that the through-contact forms a terminal contact on the semiconductor material; and
forming a terminal conductor at the through-contact.

11. The method of claim 10, further comprising:
after the formation of the recess of the gate electrode and before the formation of the through-contact, applying a dielectric and providing a contact hole in the region of the recess, the surface of the substrate being exposed in the contact hole;
performing an implantation of a dopant in the contact hole, the implantation forming a contact region in the semiconductor material;
filling the contact hole with electrically conducting material; and
arranging the contact hole within the recess in such a fashion that the dielectric electrically insulates the through-contact around the through-contact.

12. The method of claim 10, further comprising:
after the formation of the recess of the gate electrode and before the formation of the through-contact, performing an implantation of dopant, the implantation producing a contact region in the semiconductor material self-aligned to the recess.

13. The method of claim 12, further comprising:
before the implantation of dopant to form the contact region, forming side wall spacers on side walls of the recess.

14. The method according to claim 10, further comprising:
before the formation of the gate electrode, forming a doped region, on which the terminal contact is formed.

* * * * *